United States Patent [19]
Imaizumi et al.

[11] 3,761,786
[45] Sept. 25, 1973

[54] SEMICONDUCTOR DEVICE HAVING RESISTORS CONSTITUTED BY AN EPITAXIAL LAYER

[75] Inventors: Ichiro Imaizumi; Atsuo Hotta, both of Kokubunji; Michio Suzuki, Hachioji; Masami Ozawa, Ome, all of Japan

[73] Assignee: Hitachi, Ltd., Tokyo, Japan

[22] Filed: Aug. 30, 1971

[21] Appl. No.: 176,152

[30] Foreign Application Priority Data

Sept. 7, 1970 Japan ............................ 45/777670

[52] U.S. Cl. ............ 317/235 R, 148/175, 148/191, 317/234 Q, 317/235 E

[51] Int. Cl. ............................................ H01l 19/00

[58] Field of Search .................. 317/235 E; 307/303

[56] References Cited

UNITED STATES PATENTS

| | | | |
|---|---|---|---|
| 3,564,443 | 2/1971 | Nagata | 317/235 E |
| 3,676,713 | 7/1972 | Wiedmann | 307/303 |
| 3,626,390 | 12/1971 | Chang et al. | 317/235 E |
| 3,569,800 | 3/1971 | Collins | 317/235 E |
| 3,702,947 | 11/1972 | Schilling | 317/235 E |
| 3,617,827 | 11/1971 | Schmitz | 317/235 E |
| 3,643,235 | 2/1972 | Berger et al. | 317/235 E |
| 3,595,714 | 7/1971 | Thire et al. | 317/235 E |
| 3,581,165 | 5/1971 | Seelbach et al. | 317/235 E |
| 3,576,682 | 4/1971 | Frouin et al. | 317/235 E |
| 3,573,573 | 4/1971 | Moore | 317/235 E |
| 3,525,025 | 8/1970 | Lowery et al. | 317/235 E |
| 3,584,269 | 6/1971 | Thun | 317/235 E |
| 3,575,741 | 4/1971 | Murphy | 317/235 E |
| 3,615,932 | 10/1971 | Makimoto et al. | 317/235 E |
| 3,404,321 | 10/1968 | Kurosawa et al. | 317/235 E |

*Primary Examiner*—John W. Huckert
*Assistant Examiner*—William D. Larkins
*Attorney*—Craig, Antonelli & Hill

[57] ABSTRACT

A semiconductor device having resistors is disclosed, which comprises a p-type silicon substrate, first high impurity concentration p-type regions disposed in superficial portions of the substrate, an n-type silicon epitaxial layer disposed on top of the substrate and of the first high impurity concentration p-type regions, p-type out-diffusion regions occupying portions of the epitaxial layer and contiguous to the respective first high impurity concentration regions, and a second high impurity concentration p-type region occupying a superficial portion of the epitaxial layer and reaching the out-diffusion regions to thereby isolate portions of the epitaxial layer contiguous to the respective out-diffusion regions.

4 Claims, 7 Drawing Figures

INVENTORS

ICHIRO IMAIZUMI, ATSUO HOTTA,

MICHIO SUZUKI, MASAMI OZAWA

BY Craig, Antonelli & Hill

ATTORNEYS

INVENTORS
ICHIRO IMAIZUMI, ATSUO HOTTA,
MICHIO SUZUKI, MASAMI OZAWA
BY Craig, Antonelli & Hill
ATTORNEYS INVENTORS
ICHIRO IMAIZUMI, ATSUO HOTTA,
MICHIO SUZUKI, MASAMI OZAWA
BY Craig, Antonelli & Hill
ATTORNEYS INVENTORS
ICHIRO IMAIZUMI, ATSUO HOTTA,
MICHIO SUZUKI, MASAMI OZAWA
BY Craig, Antonelli & Hill
ATTORNEYS

SEMICONDUCTOR DEVICE HAVING RESISTORS CONSTITUTED BY AN EPITAXIAL LAYER

BACKGROUND OF THE INVENTION

1. Field of the Invention

This invention relates to semiconductor devices and, more particularly, to semiconductor devices having resistors constituted by an epitaxial layer.

2. Description of the Prior Art

In semiconductor devices and particularly in semiconductor integrated circuits (usually termed IC's) various circuit elements are formed in a single semiconductor chip or wafer. Among these elements resistors which are passive elements are usually constituted by impurity diffusion regions formed in a substrate and having a conductivity type opposite to that of the substrate.

For example, an impurity diffusion region formed by diffusing a p-type impurity into an n-type silicon epitaxial layer grown on top of a p-type silicon substrate may serve as a resistor. Such resistor is electrically isolated from the other circuit elements formed in the same wafer.

However, since such resistors as noted above have a higher impurity concentration than that of the substrate or epitaxial layer, their resistivity is lower than that of the substrate or epitaxial layer.

It has also been proposed to enclose a predetermined region of an epitaxial layer to constitute a resistor. In this case, however, it is necessary to form lead electrodes ohmically in direct contact with the epitaxial layer. Therefore, a high contact resistance of the ohmic contact will result, and/or the lead electrode will have a considerable area.

Because of the various restrictions as noted above imposed upon the resistor constituted by an epitaxial layer, the highest unit area resistance attainable with such resistor is only about 2 kilohms. Therefore, this type of resistor has not yet been practically employed in such circuits as memories requiring resistors of a high resistance above several kilohms.

SUMMARY OF THE INVENTION

An object of the invention is to overcome the above drawbacks and provide a semiconductor device having resistors having a high unit area resistance.

Another object of the invention is to provide a semiconductor device of a high degree of integration having resistors of a high resistance and a small area.

A further object of the invention is to provide a semiconductor device in the form of a semiconductor integrated circuit including resistors and other circuit elements, wherein the resistors are coupled to other elements without using any particular lead line.

A feature of the invention achieving the above objects resides in an out-diffusion region occupying a portion of an epitaxial layer under a resistor portion thereof and having a conductivity type opposite to that of the epitaxial layer. By the provision of this out-diffusion region, it is possible to obtain a resistor having a high resistivity per unit area.

DESCRIPTION OF THE PREFERRED EMBODIMENTS

Figure 1A:
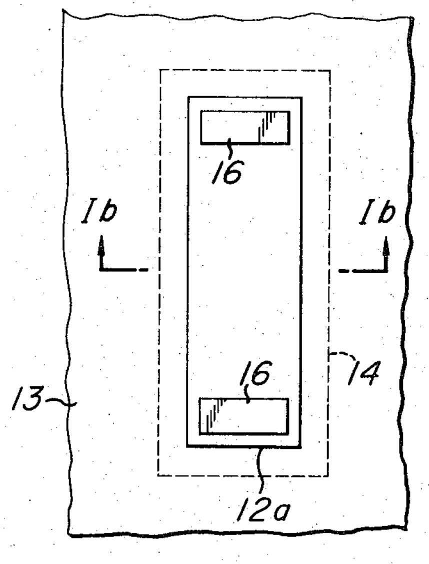
FIG. 1*a* is a plan view of an embodiment of the semiconductor device according to the invention.
Figure 1B:
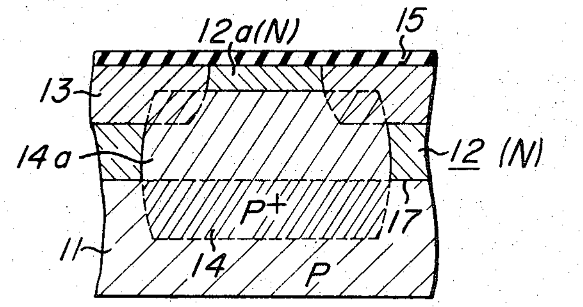
FIG. 1*b* is a sectional view taken along line I*b*—I*b* in FIG. 1*a*.

FIGS. 1*a* and 1*b* show a semiconductor device having a resistor embodying the invention. The illustrated semiconductor device comprises, for instance, a p-conductivity type silicon substrate 11, a p-type high concentration impurity diffusion region 14 occupying a portion of the substrate 11, an epitaxial layer disposed on top of the substrate surface inclusive of the diffusion region 14, an out-diffusion region 14a formed in the epitaxial layer by an out-diffusion process to be described hereinafter, a p-type high concentration impurity diffusion region 13 occupying a superficial portion of the epitaxial layer reaching the out-diffusion region 14a to electrically isolate a portion of the epitaxial layer from other elements (not shown), and an insulating film 15 formed on top of the epitaxial layer inclusive of the diffusion region 13. The portion of the epitaxial layer enclosed by the diffusion region 13 and the out-diffusion region 14a constitutes a resistor as indicated at 12*a*.

The epitaxial layer 12, diffusion region 13 and insulating film 15 are formed at temperatures around 1,000°C. During the steps of the high temperature thermal treatment, the impurity contained in the p-type high impurity concentration diffusion region 14 migrates or is out-diffused into the epitaxial layer 12 of a lower impurity concentration. Thus, a bottom portion of the epitaxial layer 12 contiguous to the diffusion region 14 undergoes inversion of the conductivity type into p-type, forming the out-diffusion region 14*a* as is illustrated. By the formation of the out-diffusion region 14*a* during the thermal treatment, the cross sectional area of the portion of the epitaxial layer constituting a current path is reduced. In other words, the cross sectional area of the elongate resistor shown in FIG. 1*a* alone is reduced without changing the length of the resistor. The resistance of the resistor increases in inverse proportion to the cross sectional area. The higher the temperature of the thermal treatment or the longer the period of the thermal treatment, the greater is the proportion of the out-diffusion region 14*a* formed in the epitaxial layer 12 and the higher is the resistance of the resistor constituted by the remaining portion of the epitaxial layer. Thus, the resistance of the resistor thus formed can be suitably selected by appropriately determining the extent of the out-diffusion into the epitaxial layer.

By way of example, if the epitaxial layer 12 has a resistivity of 0.5 ohm·cm and a thickness of 0.5 micron, its unit area resistance is about 10 kilohms.

The insulating film 15 which serves to protect the semiconductor device may be a silicon dioxide film about 7,000 to 8,000 angstroms thick formed by heating the wafer at a high temperature in an oxidizing atmosphere for one hour. Numeral 16 designates electrodes provided adjacent opposite ends of the resistor.

Figure 1C:
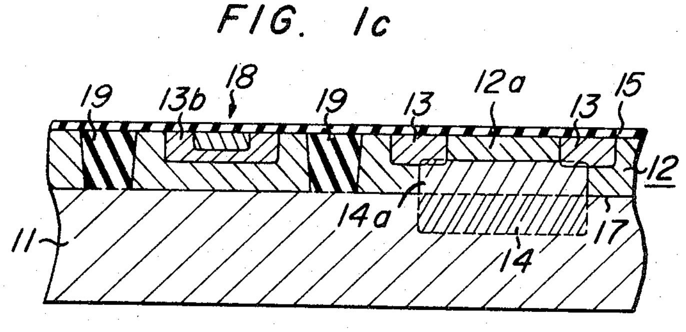
FIGS. 1*c* and 1*d* are fragmentary sectional views showing other embodiments of the semiconductor device according to the invention.

FIG. 1c shows a modification of the embodiment of FIG. 1b. In this embodiment, the depth of the diffusion region 13 is made substantially equal to the depth of the resistor 12a. By so doing, the isolation of the resistor can be accomplished in the same step of formation of, for instance, a base region 13a of a separately formed transistor 18, thus simplifying the manufacturing steps.

Figure 1D:
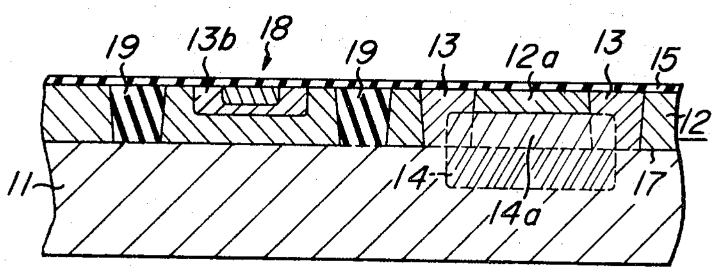

FIG. 1d shows another modification of the embodiment of FIG. 1b. In this embodiment, the depth of the p-type diffusion region 13 is equal to or greater than the thickness of the epitaxial layer 12. In this case, the p-type diffusion region 13 can be formed simultaneously with the impurity diffusion for the formation of an isolation region 19 isolating the resistor from a separately formed transistor 18, thus reducing the number of manufacturing steps involved. In FIGS. 1c and 1d, the same reference numerals are used for the corresponding parts to those in FIGS. 1a and 1b.

As has been seen, the construction according to the invention is advantageous in simplifying the manufacturing steps.

Figure 2A:
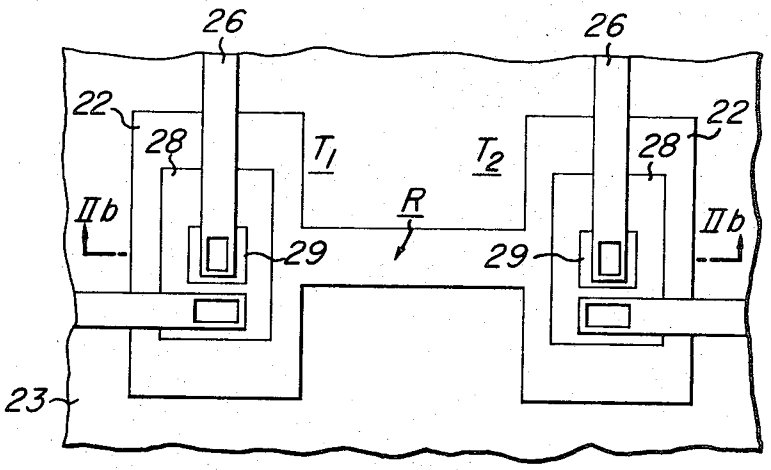
FIG. 2*a* is a plan view of a further embodiment of the semiconductor device according to the invention.
Figure 2B:
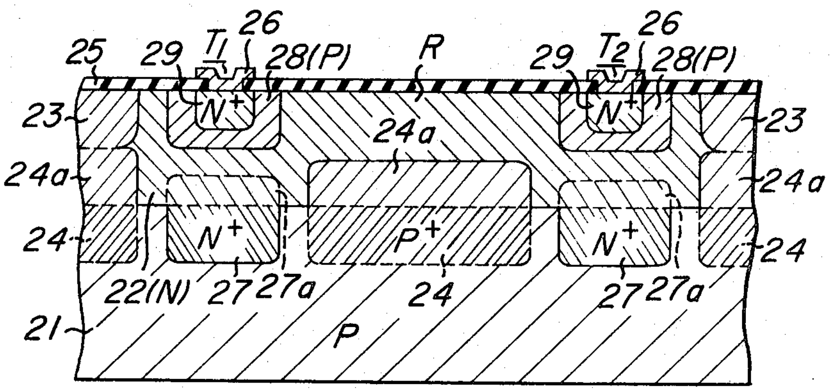
FIG. 2*b* is a sectional view taken along line II*b*—II*b* in FIG. 2*a*.

FIGS. 2a and 2b show another embodiment of the invention. FIG. 2a is a plan view showing a semiconductor integrated circuit having a high resistance resistor R extending between collector regions of two transistors $T_1$ and $T_2$ formed in a single wafer, and FIG. 2b is a section taken along line IIb—IIb in FIG. 2a. The illustrated semiconductor device comprises a p-type substrate 21, n-type high impurity concentration diffusion regions 27 with an impurity concentration of $10^{20}$ atoms/cm$^3$ for the purpose of reducing the collector resistance of the transistors, a p-type high impurity concentration diffusion region 24 with an impurity concentration of $10^{20}$ atoms/cm$^3$, an n-type epitaxial layer 22 grown on top of the surface of the substrate 21 inclusive of the diffusion regions 24 and 27, a p-type diffusion region 23 occupying a superficial portion of the epitaxial layer 22 for electrically isolating the resistor R and the transistors $T_1$ and $T_2$ from the other circuit elements, a p-type out-diffusion region 24a occupying a portion of the epitaxial layer 22 and contiguous to the diffusion region 24, and n-type out-diffusion regions 27a occupying portions of the epitaxial layer 22 and contiguous to the respective diffusion regions 27. In addition, p-type and n-type impurity diffusion regions 28 and 29 respectively constituting the base and emitter of the transistors $T_1$ and $T_2$ are formed in the epitaxial layer 22 by well-known semiconductor techniques. Further, an insulating film 25 to protect the elements and electrodes 26 are provided.

The manufacture of the construction described above of the instant embodiment involves several steps of high temperature thermal treatment of the wafer, namely the step of diffusion forming the isolation region 23 and the steps of impurity diffusion for forming the transistor structure. In these steps, out-diffusion of n-type and p-type impurities takes place, thus leading to the formation of n-type out-diffusion regions 27a serving to reduce the collector resistance of the transistors and p-type out-diffusion region 24a to provide for the high resistance resistor R. Similar to the previous embodiment of FIG. 1, the cross sectional area of the epitaxial layer resistor lying over the out-diffusion region 24a can be controlled by controlling the temperature and time of the thermal treatments noted above. Also, as is apparent from FIGS. 2a and 2b, the high resistance resistor R directly leads to the collector regions of the transistors $T_1$ and $T_2$, so that there is no need of providing an extra area for the formation of otherwise required lead electrodes. Thus, the substrate surface area occupied by the resistor can be extremely reduced, which is very advantageous in the high degree of integration of elements. By way of example, the area of the resistor in this embodiment can be made about one-tenth that required in case of a conventional semiconductor memory consisting of transistors $T_1$ and $T_2$.

Figure 3:
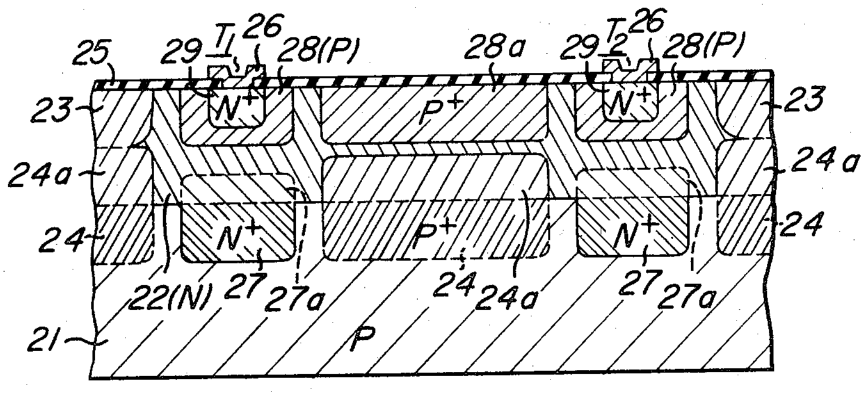
FIG. 3 is a fragmentary sectional view of a still further embodiment of the semiconductor device according to the invention.

FIG. 3 shows a modification of the preceding embodiment of FIG. 2b. In the Figure, corresponding parts to those in FIG. 2b are designated by like reference numerals. In this modification, the resistance of the resistor R is further increased by forming a p-type impurity diffusion region occupying a superficial portion 28a of the epitaxial layer 22 above the out-diffusion region 24a. The formation of the p-type diffusion region 28a apparently results in a reduced cross sectional area of the resistor R, so that the resistance thereof is further increased.

Although the foregoing embodiments have used a p-type substrate, the invention can of course be applied to semiconductor devices having an n-type substrate, that is, a substrate of the same conductivity type as that of the resistor.

As has been described in the foregoing, according to the invention it is possible to reduce the cross sectional area and increase the resistance of the resistor constituted by an epitaxial layer by the formation of an out-diffusion region, which is very advantageous where resistors having an extremely high resistance are required as in memories and for increasing the density of integration of an integrated circuit.

We claim:

1. A semiconductor device comprising:

a semiconductor substrate of one conductivity type;

a first semiconductor region of the same conductivity type as that of said substrate and of a higher impurity concentration than that of said substrate, disposed in said substrate adjacent one major surface of said substrate;

a semiconductor layer of an opposite conductivity type to that of said substrate and of a lower impurity concentration than that of said substrate, disposed on said one major surface of said substrate;

a second semiconductor region of the same conductivity type as that of said substrate and of a higher impurity concentration than that of said semiconductor layer, but of a lower impurity concentration than that of said first semiconductor region, disposed in said semiconductor layer adjacent the one portion of said one major surface, where said first semiconductor region is disposed;

two active elements disposed in said semiconductor layer so as to interpose a part of said semiconductor layer therebetween, under which said second semiconductor region is disposed, whereby said two active elements are connected with said part of said semiconductor layer; and a third semiconductor region of an opposite conductivity type to that of said semiconductor layer disposed in said semiconductor layer reaching said substrate so as to surround said two active elements and said part of said semiconductor layer.

2. A semiconductor device according to claim 1, further comprising a fourth semiconductor region of the same conductivity type as that of said substrate and of a higher impurity concentration than that of said substrate disposed in said semiconductor layer, adjacent said second semiconductor region, but being separated from said second semiconductor region by a specified distance, so as to interpose a selected portion of said semiconductor layer therebetween.

3. A semiconductor device according to claim 1, further comprising a pair of respective fourth semiconductor regions of the same conductivity as said semiconductor layer and a higher impurity concentration than that of said semiconductor layer, disposed in said substrate adjacent said one major surface beneath said active elements and having said first semiconductor region disposed therebetween, and a pair of respective fifth semiconductor regions of the same conductivity type as said semiconductor layer and of a higher impurity concentration than that of said semiconductor layer, disposed in said semiconductor layer adjacent said major surface, where said respective fourth semiconductor regions are disposed, so as to have said second semiconductor region disposed therebetween.

4. A semiconductor device according to claim 3, further comprising a sixth semiconductor region of the same conductivity type as that of said substrate and of a higher impurity concentration than that of said substrate disposed in said semiconductor layer, adjacent said second semiconductor region, but being separated from said second semiconductor region by a specified distance, so as to interpose a selected portion of said semiconductor layer therebetween.

* * * * *